US009077512B2

(12) United States Patent
Olejarz et al.

(10) Patent No.: US 9,077,512 B2
(45) Date of Patent: Jul. 7, 2015

(54) LOCK DETECTOR FOR PHASE-LOCKED LOOP

(71) Applicant: Analog Devices, Inc., Norwood, MA (US)

(72) Inventors: Piotr Olejarz, Watertown, MA (US); Ara Arakelian, Watertown, MA (US); Lewis Malaver, South Boston, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/030,824

(22) Filed: Sep. 18, 2013

(65) Prior Publication Data

US 2015/0078501 A1    Mar. 19, 2015

(51) Int. Cl.
 *H04L 7/033* (2006.01)
 *H03L 7/08* (2006.01)
(52) U.S. Cl.
 CPC .............. *H04L 7/0332* (2013.01); *H04L 7/033* (2013.01); *H03L 7/0805* (2013.01)
(58) Field of Classification Search
 CPC ............... H03L 7/06; H03L 7/07; H03L 7/08; H03L 7/0805; H03L 7/0807; H03L 7/081; H03L 7/0814; H03L 7/0816; H03L 7/0818; H03L 7/085; H03L 7/087; H03L 7/089; H03L 7/0891; H03L 7/0893; H03L 7/091; H03L 7/093; H03L 7/095; H03L 7/18; H03L 7/22; H03L 2207/06; H03L 2207/50; H04L 7/033; H04L 7/0331; H04L 7/0332

USPC .......... 375/326, 327, 360, 373–376; 327/147, 327/148, 151, 156, 157, 160
See application file for complete search history.

(56) References Cited

U.S. PATENT DOCUMENTS

| 6,614,317 | B2 | 9/2003 | Wong et al. | |
|---|---|---|---|---|
| 6,879,195 | B2 | 4/2005 | Green et al. | |
| 7,323,946 | B2 | 1/2008 | Seefeldt et al. | |
| 8,779,812 | B1* | 7/2014 | Kavanagh et al. | 327/150 |
| 2004/0095197 | A1* | 5/2004 | Wang et al. | 331/100 |
| 2005/0012524 | A1* | 1/2005 | Green et al. | 327/3 |
| 2005/0078783 | A1* | 4/2005 | Okita | 375/376 |
| 2006/0226914 | A1* | 10/2006 | Saado | 331/1 A |
| 2009/0251226 | A1* | 10/2009 | Kathuria et al. | 331/1 R |
| 2012/0098570 | A1 | 4/2012 | Wang et al. | |

\* cited by examiner

*Primary Examiner* — Young T Tse (57) ABSTRACT

A clock alignment detector described herein can detect alignment between clock signals within a defined margin of error, such as a defined margin of phase error. The margin of phase error can be varied to achieve various degrees of lock detection precision. Clock alignment detector can detect alignment between rising edges of the clock signals, falling edges of the clock signals, or both the rising and falling edges of the clock signals. The clock alignment detector can be implemented as a lock detector for a phase-locked loop that is configured to detect and maintain a phase relationship between a reference clock signal and a feedback clock signal, where the clock alignment detector detects alignment between the reference clock signal and the feedback clock signal.

25 Claims, 8 Drawing Sheets

LOCK DETECTOR FOR PHASE-LOCKED LOOP

TECHNICAL FIELD

The present disclosure relates generally to clock alignment detectors and associated methods of clock alignment detection, and more particularly, to lock detectors and associated methods of lock detection for phase-locked loops.

BACKGROUND

Phase-locked loops are extensively used in various electronic applications. A phase-locked loop (PLL) generates an output signal having a phase relative to an input signal (often referred to as a reference signal). The PLL can detect any phase error (difference) between the input signal and the output signal and adjust the phase of the output signal based on the phase error. Oftentimes, a lock detector is implemented to monitor the input signal and the output signal of the PLL to determine whether the PLL has achieved a locked state (condition) that indicates phase alignment between the input signal and the output signal. Although existing lock detectors and associated methods for lock detection for PLLs have been generally adequate for their intended purposes, they have not been entirely satisfactory in all respects.

BRIEF DESCRIPTION OF DRAWINGS

The present disclosure is best understood from the following detailed description when read with the accompanying figures. It is emphasized that, in accordance with the standard practice in the industry, various features are not drawn to scale and are used for illustration purposes only. In fact, the dimension of the various features may be arbitrarily increased or reduced for clarity of discussion.

OVERVIEW OF EXAMPLE EMBODIMENTS

A clock alignment detector and associated methods for lock detection are described herein. The clock alignment detector can detect alignment between clock signals within a defined margin of error, such as a defined margin of phase error. The margin of phase error can be varied to achieve various degrees of lock detection precision. Clock alignment detector can detect alignment between rising edges of the clock signals, falling edges of the clock signals, or both the rising and falling edges of the clock signals.

In various implementations, the clock alignment detector can include an alignment state detector configured to generate a delayed alignment state signal that indicates an alignment state of a first clock signal and a second clock signal; a delayed alignment state detector configured to generate at least two alignment state signals that indicate a state of the delayed alignment state signal when triggered by edges of the first clock signal and the second clock signal; and an edge alignment state detector configured to generate an edge alignment state signal based on the at least two alignment state signals, wherein the edge alignment state signal indicates an alignment state of edges of the first clock signal and the second clock signal. The clock alignment detector can further include a timer configured to generate a lock detect signal based on the edge alignment state detector after a defined time period.

In various implementations, the clock alignment detector can be implemented as a lock detector for a phase-locked loop configured to detect and maintain a phase relationship between a reference clock signal and a feedback clock signal, where the clock alignment detector detects alignment between the reference clock signal and the feedback clock signal.

DETAILED DESCRIPTION OF EXAMPLE EMBODIMENTS

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples. This repetition is for the purpose of simplicity and clarity and does not in itself dictate a relationship between the various embodiments and/or configurations discussed.

Figure 1:
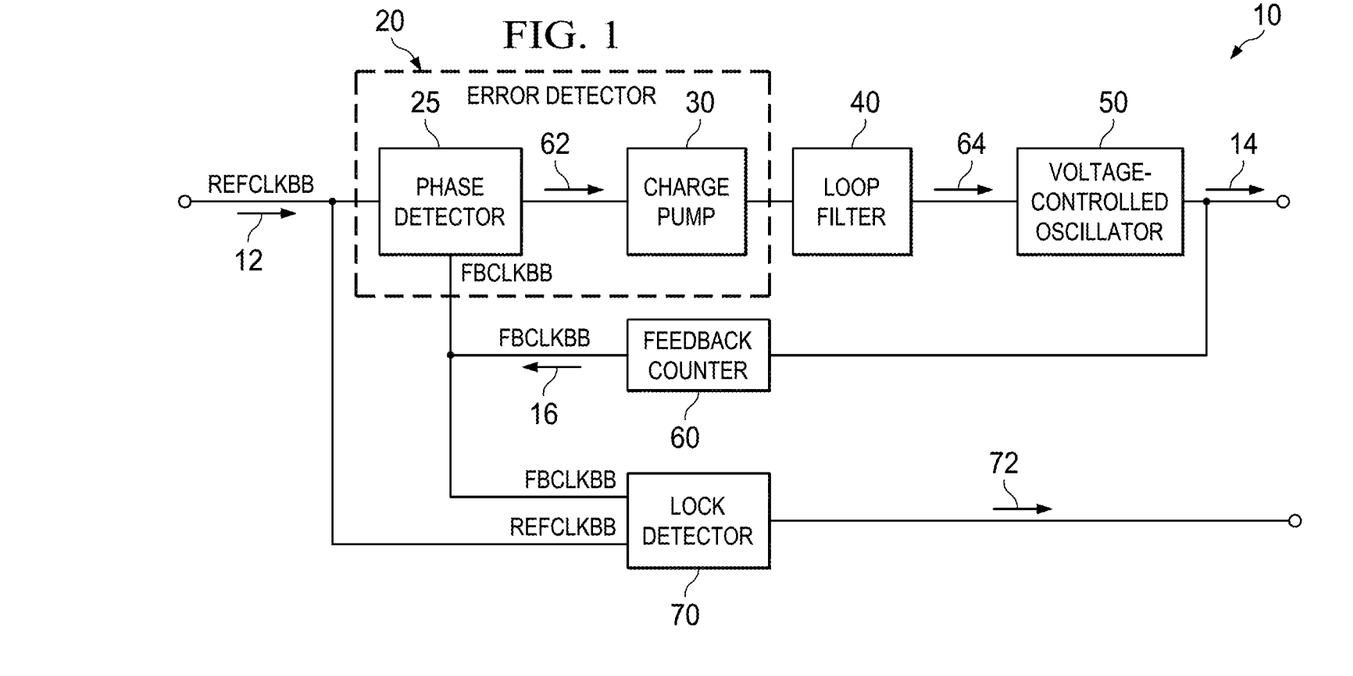
FIG. 1 is a schematic block diagram of an exemplary phase-locked loop according to various aspects of the present disclosure.

Phase-locked loops are extensively used in various electronic applications. Turning to FIG. 1, a schematic block diagram of an exemplary phase-locked loop (PLL) 10 is provided according to various aspects of the present disclosure. PLL 10 is an electronic device (including an electronic circuit and/or one or more components) configured to generate an output signal having a phase relative to an input signal (often referred to as a reference signal). For example, in the depicted embodiment, PLL 10 receives an input signal 12 and generates an output signal 14 having a phase relative to the input signal 12. In the depicted embodiment, PLL 10 represents a feedback control system that combines an oscillator and a phase comparator connected such that the oscillator maintains a constant phase angle relative to a reference signal, such as input signal 12. For example, as described below, PLL 10 can include an error detector 20 that includes a phase detector 25 and a charge pump 30; a loop filter 40; a voltage controlled oscillator (VCO) 50; and a feedback counter (divider) 60. FIG. 1 has been simplified for the sake of clarity to better understand the inventive concepts of the present disclosure. Additional features can be added in the PLL 10, and some of the features described below can be replaced or eliminated in other embodiments of the PLL 10.

Phase detector 25 is configured to respond to differences in a frequency and/or a phase between input signal 12 and an input signal 16, adjusting a frequency of the VCO 50 until a frequency and/or a phase of the output signal 14 matches the frequency and/or phase of the input, reference signal 12. For example, phase detector 25 determines a phase difference between incoming signals, for example, between input signal 12 and input signal 16. In various implementations, input signal 12 can be received from a clock generator, such as a high-precision oscillator such as a crystal or temperature-controlled crystal oscillator. In various implementations, input signal 16 can be feedback from the PLL 10, particularly feedback from the VCO 50. In the depicted embodiment, input signal 16 represents output signal 14, where feedback counter 60 sets a relationship, such as a frequency relationship, between input signal 12 and output signal 14. For example, feedback counter 60 processes and conditions output signal 14 to generate input signal 16 (here, feedback clock signal FBCLKBB). In various implementations, feedback counter 60 is a frequency divider, such as a feedback divider with a ratio of 1/N, where feedback counter 60 divides output signal 14 down to a lower frequency, thereby generating input signal 16.

In the depicted embodiment, phase detector 25 determines a phase difference between a reference clock signal REFCLKBB (input signal 12) and a feedback clock signal FBCLKBB (input signal 16, also referred to as feedback signal 16), and generates a control (error) signal 62 depending on the phase difference. The control signal 62 is proportional to the phase (and/or frequency) difference between input signal 12 and input signal 16. In an example, control signal 62 is an up control signal or a down control signal based on whether a frequency of FBCLKBB lags or leads a frequency of REFCLKBB.

Based on the control signal 62 received from phase detector 25, charge pump 30 and loop filter 40 (such as a low-pass filter) generate a control signal 64, which represents a control voltage for VCO 50. Charge pump 30 can convert control signal 62 into positive or negative current pulses in proportion to the phase error, and loop filter 40 can integrate the current pulses from charge pump 30 to smooth out the control signal 64, for example, by removing noise and other undesirable components from the control signal 62, thereby providing a stable control signal 64 to VCO 50. In various implementations, when the frequency of output signal 14 lags the frequency of input signal 12 (in other words, FBCLKBB frequency lags REFCLKBB frequency), control signal 62 generated by phase detector 25 causes charge pump 30 to drive current into loop filter 40, such that VCO 50 increases the frequency of output signal 14 based on the control signal 64. Similarly, in various implementations, when the frequency of output signal 14 leads the frequency of input signal 12 (in other words, FBCLKBB frequency leads REFCLKBB frequency), control signal 62 generated by phase detector 25 causes charge pump 30 to draw current from loop filter 40, such that VCO 50 decreases the frequency of output signal 14 based on the control signal 64.

Output signal 14 thus has a frequency proportional to the control signal 64. For example, when the control voltage of the control signal 64 increases, VCO 50 increases a frequency of output signal 14, and when the control voltage of the control signal 64 decreases, VCO 50 decreases the frequency of output signal 14. PLL 10 ensures that the frequency of the output signal 14 locks into the input, reference signal 12, thereby stabilizing the output of VCO 50, which can be used in various applications. When input signal 12 (here, REFCLKBB) and input signal 16 (here, FBCLKBB) have matching phase and frequency, input signal 12 is aligned or locked with input signal 16, and PLL 10 is in a locked condition.

A lock detector 70 can determine an alignment (locked) state or condition of PLL 10 by monitoring the input signals of phase detector 25, and generate a lock detect signal 72 that indicates the alignment state of PLL 10. In the depicted embodiment, lock detector 70 determines whether reference clock signal REFCLKBB (incoming signal 12) locks (aligns) with feedback clock signal FBCLKBB (feedback signal 16) and generates lock detect signal 72 indicating the alignment state. For example, lock detector 70 outputs a high voltage signal (HIGH output) when the clock signals are aligned, and thus have a same phase, and lock detector 70 outputs a low voltage signal (LOW output) when the clock signals are not aligned, and thus have different phases. In various implementations, lock detect signal 72 can be a digital one when PLL 10 is in a locked state (meaning the clock signals are aligned) or a digital zero when PLL 10 is in an unlocked state (meaning the clock signals are not aligned).

Lock detector 70 can have various configurations to detect the lock state of PLL 10. For example, in various implementations, lock detector 70 can include a counter that counts a defined time and/or a defined number of cycles that ensures PLL 10 has reached a locked state. In various implementations, lock detector 70 can further be configured to ensure that a control voltage of the control signal 64 is within a certain range before determining that PLL 10 has reached the locked state. The following discussion explores various lock detection mechanisms that can improve lock detection for PLL 10.

Figure 2:
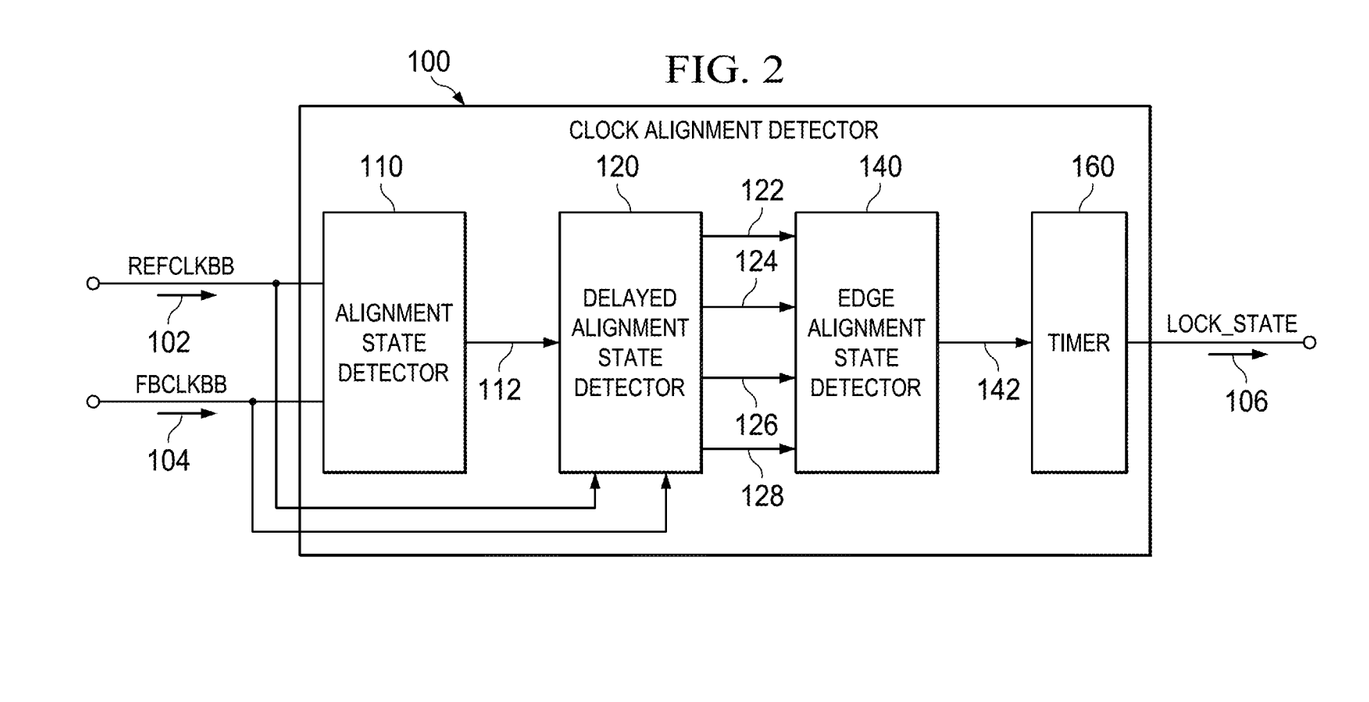
FIG. 2 is a schematic block diagram of an exemplary clock alignment detector, which can be implemented as a lock detector for the phase-locked loop of FIG. 1, according to various aspects of the present disclosure.

FIG. 2 is a schematic block diagram of an exemplary clock alignment detector 100 according to various aspects of the present disclosure. The clock alignment detector 100 is an electronic device (including an electronic circuit and/or one or more components) configured to detect and indicate an alignment (lock) state between clock signals within a variable margin of error, such as a variable margin of phase error. For example, clock alignment detector 100 monitors input clock signals (such as an input signal 102 and an input signal 104) and generates an output signal 106 that indicates an alignment (lock) state between the input clock signals. Further, as described below, clock alignment detector 100 can detect clock alignment on rising edges, falling edges, or both the rising edges and the falling edges of the monitored clock signals. FIG. 2 has been simplified for the sake of clarity to better understand the inventive concepts of the present disclosure. Additional features can be added in the clock alignment detector 100, and some of the features described below can be replaced or eliminated in other embodiments of the clock alignment detector 100.

Clock alignment detector 100 can be implemented in any system or device that necessitates a clock alignment (lock) detection mechanism, such that the system/device can detect promptly when a clock is stable and/or when the clock has deviated from its desired clock. For purposes of the following discussion, in various implementations, clock alignment detector 100 is implemented as the lock detector 70 for PLL 10 in FIG. 1, such that clock alignment detector 100 determines an alignment (lock) state between reference clock signal REFCLKBB (depicted as input signal 102 in FIG. 2 and input signal 12 in FIG. 1) and feedback clock signal FBCLKBB (depicted as input signal 104 in FIG. 2 and input signal 16 in FIG. 1) and generates lock detect signal LOCK_STATE (depicted as output signal 106 in FIG. 2 and lock detect signal 72 in FIG. 1) that indicates the alignment (lock) state.

Figure 3:
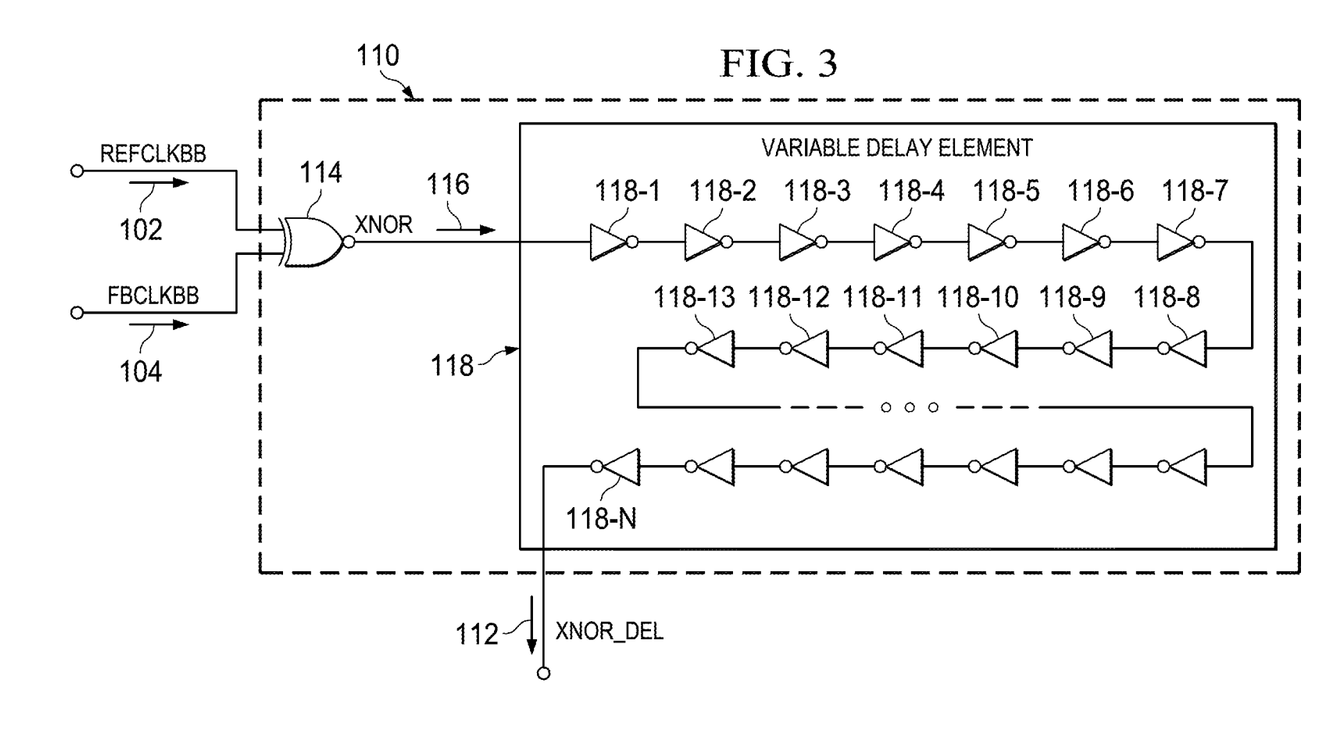
FIG. 3 is a schematic circuit diagram of an exemplary alignment state circuit that can be implemented in the clock alignment detector of FIG. 2 according to various aspects of the present disclosure.
Figure 4:
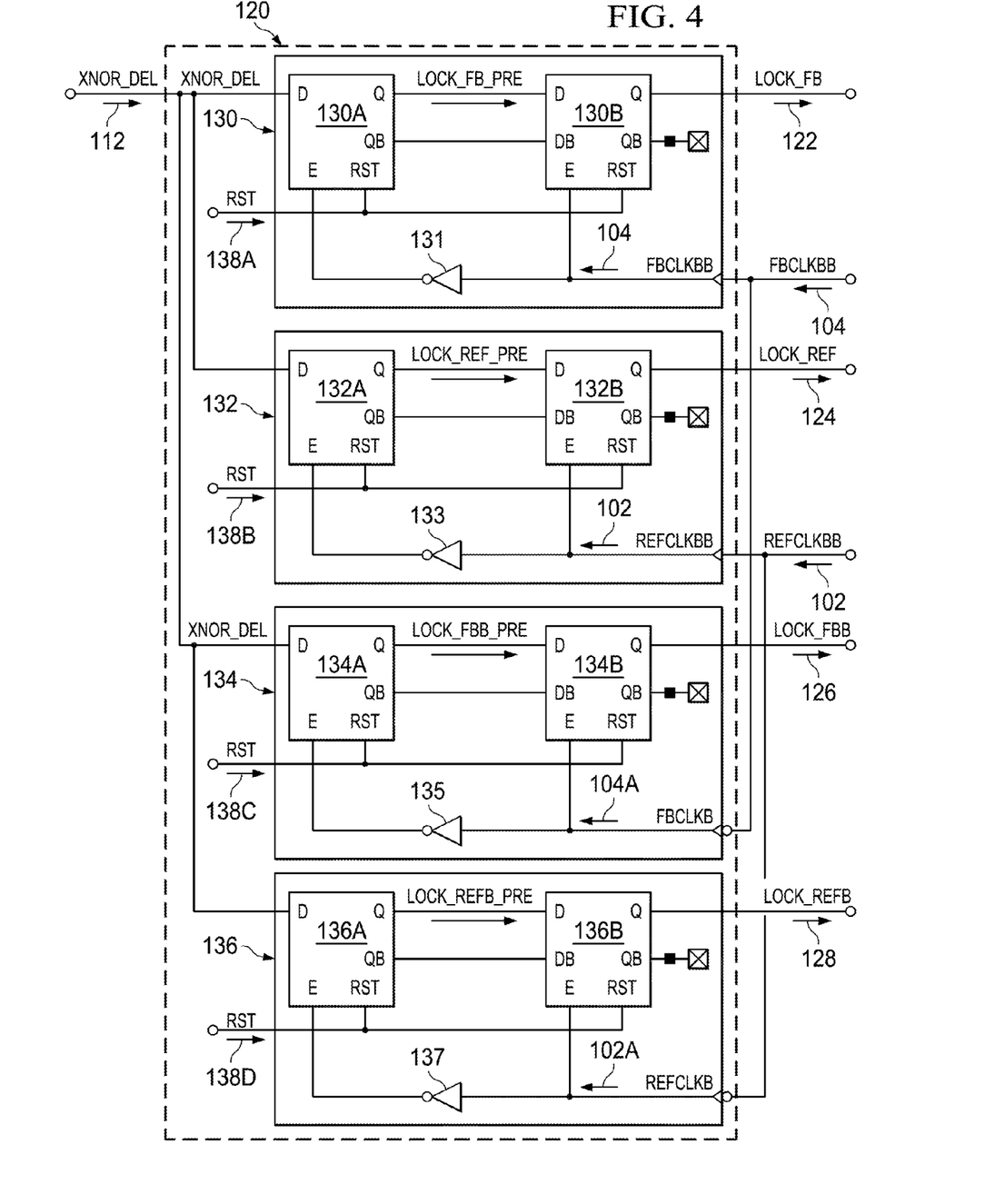
FIG. 4 is a schematic circuit diagram of an exemplary delayed alignment state circuit that can be implemented in the clock alignment detector of FIG. 2 according to various aspects of the present disclosure.
Figure 5:
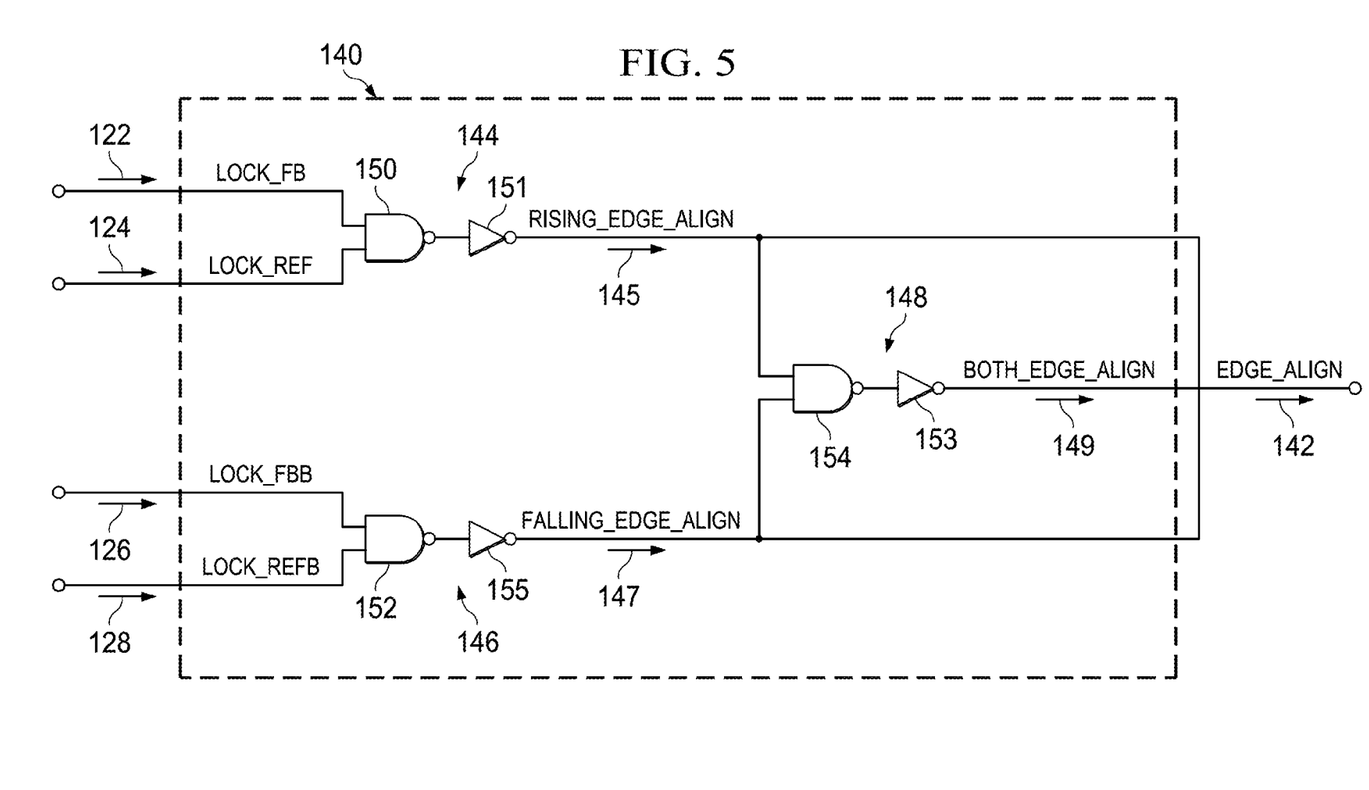
FIG. 5 is a schematic circuit diagram of an exemplary edge alignment state circuit 140 that can be implemented in the clock alignment detector of FIG. 2 according to various aspects of the present disclosure.

Clock alignment detector 100 includes an alignment state detector 110, a delayed alignment state detector 120, an edge alignment state detector 140, and a timer 160. FIG. 3 is a schematic circuit diagram of an exemplary alignment state detector 110 of the clock alignment detector 100 according to various aspects of the present disclosure; FIG. 4 is a schematic circuit diagram of an exemplary delayed alignment state detector 120 of the clock alignment detector 100 according to various aspects of the present disclosure; and FIG. 5 is a schematic block diagram of an exemplary edge alignment state detector 140 of the clock alignment detector 100 according to various aspects of the present disclosure. FIG. 3, FIG. 4, and FIG. 5 have been simplified for the sake of clarity to better understand the inventive concepts of the present disclosure. Additional features can be added in alignment state detector 110, delayed alignment state detector 120, edge alignment state detector 140, and timer 160, and some of the features described below can be replaced or eliminated in other embodiments of the alignment state detector 110, delayed alignment state detector 120, edge alignment state detector 140, and timer 160.

Turning to FIG. 2 and FIG. 3, alignment state detector 110 detects a general alignment (lock) state of input signal 102 and input signal 104 and provides an alignment state signal that indicates the general alignment state of the input signals. Alignment state detector 110 also introduces a delay to the alignment state signal, thereby generating a delayed alignment state signal 112. By delaying the alignment state signal, clock alignment detector 100 can ensure that input signal 102 and input signal 104 are aligned within a certain margin of error. The delay introduced can be varied to achieve various margins of error, such that clock alignment detector 100 provides a clock alignment detection scheme that can be adapted for various applications, for example, depending on a precision level needed for clock alignment.

In the depicted embodiment, alignment state detector 110 includes an exclusive NOR (XNOR) gate 114. XNOR gate 114 receives clock signals that are to be aligned (also referred to as locked or synchronized)—here, input signal 102 and input signal 104 received by the clock alignment detector 100. XNOR gate 114 compares input signal 102 with input signal 104 and generates an alignment state signal 116 that indicates the general alignment state of input signal 102 and input signal 104. For example, XNOR gate 114 outputs a high voltage signal (HIGH output) when the clock signals are aligned, and thus have a same phase, and XNOR gate 114 outputs a low voltage signal (LOW output) when the clock signals are not aligned, and thus have different phases. In the depicted embodiment, XNOR gate 114 receives reference clock signal REFCLKBB and feedback clock signal FBCLKBB from PLL 10 and generates alignment state signal 116, depicted as XNOR signal in FIG. 3, indicating whether the reference clock signal REFCLKBB is aligned with the feedback clock signal FBCLKBB. In various implementations, a frequency of the feedback clock signal FBCLKBB has been divided down (for example, by feedback counter 60 of PLL 10) so that feedback clock signal FBCLKBB has a same frequency as reference clock signal REFCLKBB.

In furtherance of the depicted embodiment, alignment state detector 110 includes a variable delay element 118 connected to XNOR gate 114. Variable delay element 118 delays alignment state signal 116 received from XNOR gate 114, thereby providing the delayed alignment state signal 112. By delaying the alignment state signal 116, variable delay element 118 enables the clock alignment detector 100 to determine whether the clock signals are aligned with each other within a certain margin of phase error. For example, variable delay element 118 has a propagation delay, T, which can be varied (programmed) to introduce varying amounts of delay to alignment state signal 116. In the depicted embodiment, variable delay element 118 includes an inverter-based circuit that includes a chain of inverters 118-1, 118-2, 118-3, . . . 118-N, where N is a total number of inverters in the chain of inverters. Each inverter 118-1, 118-2, 118-3 . . . 118-N has an associated variable delay. The various associated variable delays can be set or programmed to achieve a desired propagation delay, T, for delaying alignment state signal 116. In various implementations, a delay can be increased by increasing a number of inverters in the chain of inverters, and the delay can be decreased by decreasing the number of inverters in the chain of inverters. In the depicted example, variable delay element 118 receives the XNOR signal (alignment state signal 116) from XNOR gate 114 and outputs XNOR_DEL signal (delayed alignment state signal 112), which is delayed relative to the XNOR signal by an amount defined by the programmable propagation delay of variable delay element 118.

Turning to FIG. 2 and FIG. 4, delayed alignment state detector 120 detects a state (condition) of the delayed alignment state signal 112 based on a timing of rising edges of input signal 102, falling edges of input signal 102, rising edges of input signal 104, and falling edges of input signal 104. In the depicted embodiment, delayed alignment state detector 120 receives and evaluates delayed alignment state signal 112 with reference to various edges of the clock signals, thereby generating an alignment state signal 122 that represents the state of the delayed alignment state signal 112 on rising edges of input signal 104, an alignment state signal 124 that represents the state of the delayed alignment state signal 112 on rising edges of input signal 102, an alignment state signal 126 that represents the state of the delayed alignment state signal 112 on falling edges of input signal 104, and an alignment state signal 128 that represents the state of the delayed alignment state signal 112 on falling edges of input signal 102. Delayed alignment state detector 120 can thus evaluate the alignment state of the clock signals on rising edges, falling edges, or all edges of the input signals.

Delayed alignment state detector 120 can include a flip flop 130, a flip flop 132, a flip flop 134, and a flip flop 136. Each flip flop receives the delayed alignment state signal 112 (here, the XNOR_DEL signal), where flip flops 130, 132, 134, and 136 are individually clocked by one of the clock signals that are to be aligned—here, input signal 102 and input signal 104—or an inverted version of one of the clock signals—here, input signal 102A and input signal 104A. In the depicted embodiment, flip flop 130 receives XNOR_DEL signal 112 and a non-inverting clock signal, feedback clock signal FBCLKBB (input signal 104); flip flop 132 receives XNOR_DEL signal 112 and a non-inverting clock signal, reference clock signal REFCLKBB (input signal 102); flip flop 134 receives XNOR_DEL signal 112 and an inverting clock signal, inverted feedback clock signal FBCLKB (input signal 104A); and flip flop 136 receives XNOR_DEL signal 112 and an inverting clock signal, inverted reference clock signal REFCLKB (input signal 102A). Accordingly, flip flop 130 is triggered by rising edges of the feedback clock signal FBCLKBB, such that flip flop 130 generates alignment state signal 122 (depicted as LOCK_FB) representing a state of XNOR_DEL signal 112 on rising edges of the feedback clock signal FBCLKBB; flip flop 132 is triggered by rising edges of the reference clock signal REFCLKBB, such that flip flop 132 generates alignment state signal 124 (depicted as LOCK_REF) representing a state of XNOR_DEL signal 112 on rising edges of the reference clock signal REFCLKBB; flip flop 134 is triggered by falling edges of the feedback clock signal FBCLKBB, such that flip flop 134 generates alignment state signal 126 (depicted as LOCK_FBB) representing a state of XNOR_DEL signal 112 on falling edges of the feedback clock signal FBCLKBB; and flip flop 136 is triggered by falling edges of the reference clock signal REFCLKBB, such that flip flop 136 generates alignment state signal 128 (depicted as LOCK_REFB) representing a state of XNOR_DEL signal 112 on falling edges of the reference clock signal REFCLKBB.

In various implementations, each flip flop, clocked by its respective clock, can store a state (condition) of the delayed alignment state signal 112 (XNOR_delay), and can register a HIGH output when the delayed alignment state signal 112 indicates an aligned (locked) condition between the clock signals (input signal 102 and input signal 104) or a LOW output when the delayed alignment state signal 112 indicates a misaligned (out of lock) condition between the clock signals. The programmable delay added to the delayed alignment state signal 112 allows for a margin of phase error, such that (1) when a misalignment between input signal 102 and input signal 104 is shorter than the programmable delay, the short misalignment is delayed beyond a time that the flip is clocked, so that delayed alignment state signal 112 will have a HIGH output when the flip flop is clocked, such the flip flop registers a HIGH output indicating an aligned (lock) condition and (2) when a misalignment is longer than the programmable delay (for example, likely resulting from PLL 10 not being settled yet), delayed alignment state signal 112 will still have a LOW output when the flip flop is clocked, such that the flip flop registers a LOW output indicating a misaligned (out of lock) condition.

In the depicted embodiment, flip flops 130, 132, 134, and 136 are edge-triggered D-type flip flops having a set of D latches connected in series and a clock signal connected to an enable clock input (E input) of the latches, one directly and one through an inverter. For example, flip flop 130 includes a latch 130A, a latch 130B, and an inverter 131, where the feedback clock signal FBCLKBB is connected to the E inputs of the latches; flip flop 132 includes a latch 132A, a latch 132B, and an inverter 133, where the reference clock signal REFCLKBB is connected to the E inputs of the latches; flip flop 134 includes a latch 134A, a latch 134B, and an inverter 135, where the inverted feedback clock signal FBCLKB is connected to the E inputs of the latches; and flip flop 136 includes a latch 136A, a latch 136B, and an inverter 137, where the inverted reference clock signal REFCLKB is connected to the E inputs of the latches. Each of the latches also has a RST input for receiving a reset signal—a reset signal 138A for latches 130A and 130B, where content of a storage element of latch 130A is set to a HIGH output (for example, a digital one) and content of a storage element of latch 130B is set to a LOW output (for example, a digital zero) upon receiving the reset signal 138A; a reset signal 138B for latches 132A and 132B, where content of a storage element of latch 132A is set to a HIGH output and content of a storage element of latch 132B is set to a LOW output upon receiving the reset signal 138B; a reset signal 138C for latches 134A and 134B, where content of a storage element of latch 134A is set to a HIGH output and content of a storage element of latch 134B is set to a LOW output upon receiving the reset signal 138C; and a reset signal 138D for latches 136A and 136B, where content of a storage element of latch 136A is set to a HIGH output and content of a storage element of latch 136B is set to a LOW output upon receiving the reset signal 138D.

Turning to FIG. 2 and FIG. 5, edge alignment state detector 140 detects an alignment (lock) state on the rising edges, falling edges, and/or both the rising edges and the falling edges of the input signal 102 and the input signal 104. For example, edge alignment state detector 140 receives and evaluates alignment state signal 122, alignment state signal 124, alignment state signal 126, and alignment state signal 128, thereby generating an edge alignment state signal 142 that indicates an alignment state of the rising edges, falling edges, or both the rising/falling edges of input signal 102 and input signal 104. Edge alignment state detector 140 includes a rising edge alignment state detector 144 that generates a rising edge alignment state signal 145 (here, a RISING_EDGE_ALIGN signal) that indicates an alignment (lock) condition on rising edges of input signal 102 and input signal 104; a falling edge alignment state detector 146 that generates a falling edge alignment state signal 147 (here, a FALLING_EDGE_ALIGN signal) that indicates an alignment (lock) condition on falling edges of input signal 102 and input signal 104; and a rising/falling edge alignment state detector 148 that generates a rising/falling edge alignment state signal 149 (here, a BOTH_EDGE_ALIGN signal) that indicates an alignment (lock) condition on both rising edges and falling edges of input signal 102 and input signal 104. Depending on an application's desired lock detection mechanism, edge alignment state signal 142 is rising edge alignment state signal 145, falling edge alignment state signal 147, or rising/falling edge alignment state signal 149.

In the depicted embodiment, rising edge alignment state detector 144 includes a negated AND (NAND) gate 150 connected in series with an inverter 151. NAND gate 150 receives alignment state signal 122 of flip flop 130 (LOCK_FB), which is clocked by input signal 104 (feedback clock signal FBCLKBB), and alignment state signal 124 (LOCK_REF) of flip flop 132, which is clocked by input signal 102 (reference clock signal REFCLKBB). NAND gate 150 compares alignment state signal 122 with alignment state signal 124 and generates an output that indicates an alignment state of the rising edges of input signal 102 and input signal 104. Inverter 151 receives the output of NAND gate 150 and generates an output opposite the received output from NAND gate 150. In various implementations, rising edge alignment state detector 144 outputs a high voltage signal (HIGH output) when the rising edges of input signals 102 and 104 are aligned, and outputs a low voltage signal (LOW output) when rising edges of the input signal 102 and 104 are not aligned. For example, rising edge alignment state signal 145 can be a digital one indicating that rising edges of the input signals are aligned or a digital zero indicating that rising edges of the input signals are not aligned.

Similarly, in the depicted embodiment, falling edge alignment state detector 146 includes an NAND gate 152 connected in series with an inverter 153. NAND gate 152 receives alignment state signal 126 of flip flop 134 (LOCK_FBB), which is clocked by inverted input signal 104A (inverted feedback clock signal FBCLKB), and alignment state signal 128 (LOCK_REFB) of flip flop 136, which is clocked by inverted input signal 102A (inverted reference clock signal REFCLKB). NAND gate 152 compares alignment state signal 126 with alignment state signal 128 and generates an output that indicates an alignment state of the falling edges of input signal 102 and input signal 104. Inverter 153 receives the output of NAND gate 152 and generates an output opposite the received output from NAND gate 152. In various implementations, falling edge alignment state detector 146 outputs a high voltage signal (HIGH output) when the falling edges of input signals 102 and 104 are aligned, and outputs a low voltage signal (LOW output) when falling edges of the input signals 102 and 104 are not aligned. For example, falling edge alignment state signal 147 can be a digital one indicating that falling edges of the input signals are aligned or a digital zero indicating that falling edges of the input signals are not aligned.

In furtherance of the depicted embodiment, rising/falling edge alignment state detector 148 includes an NAND gate 154 connected in series with an inverter 155. NAND gate 154 receives rising edge alignment state signal 145 (RISING_EDGE_ALIGN) and falling edge alignment state signal 147 (FALLING_EDGE_ALIGN). NAND gate 154 compares rising edge alignment state signal 145 with falling edge alignment state signal 147 and generates an output that indicates an alignment state of both the rising and falling edges of input signal 102 and input signal 104. Inverter 155 receives the output of NAND gate 154 and generates an output opposite the received output from NAND gate 154. In various implementations, rising/falling edge alignment state detector 148 outputs a high voltage signal (HIGH output) when both the rising and falling edges of input signals 102 and 104 are aligned, and outputs a low voltage signal (LOW output) when both the rising and falling edges of input signals 102 and 104 are not aligned. For example, rising/falling edge alignment state signal 149 can be a digital one indicating that both the rising and falling edges of the input signals are aligned or a digital zero indicating that both the rising and falling edges of the input signals are not aligned.

Turning again to FIG. 2, timer 160 can stabilize lock detection of the clock alignment detector 100 by ensuring that input signals 102 and 104 are aligned (locked) before releasing lock detect signal 106. In the depicted embodiment, timer 160 (which can include a counter) receives edge alignment state signal 142 (here, EDGE_ALIGN) and asserts lock detect signal 106 after a defined time and/or a defined number of cycles (for example, clock cycles or time cycles) that can ensure stable alignment between input signal 102 and input signal 104. For example, when edge alignment state signal 142 is a high voltage signal (HIGH output) after the defined time and/or defined number of cycles, clock alignment detector 100 can ensure that PLL 10 has achieved a locked state between rising edges, falling edges, or both rising and falling edges of the reference clock signal and the feedback clock signal (note that, depending on the lock detection mechanism desired, edge alignment state signal 142 is either rising edge alignment state signal 145, falling edge alignment state signal 147, or rising/falling edge alignment state signal 149). In various implementations, timer 160 outputs a high voltage signal (HIGH output) when edge alignment state signal 142 has a HIGH output, and outputs a low voltage signal (LOW output) when edge alignment state signal 142 has a LOW output. For example, lock detect signal 106 can be a digital one indicating that PLL 10 has reached a locked state or a digital zero indicating that PLL 10 has not yet reached a locked state.

Figure 6:
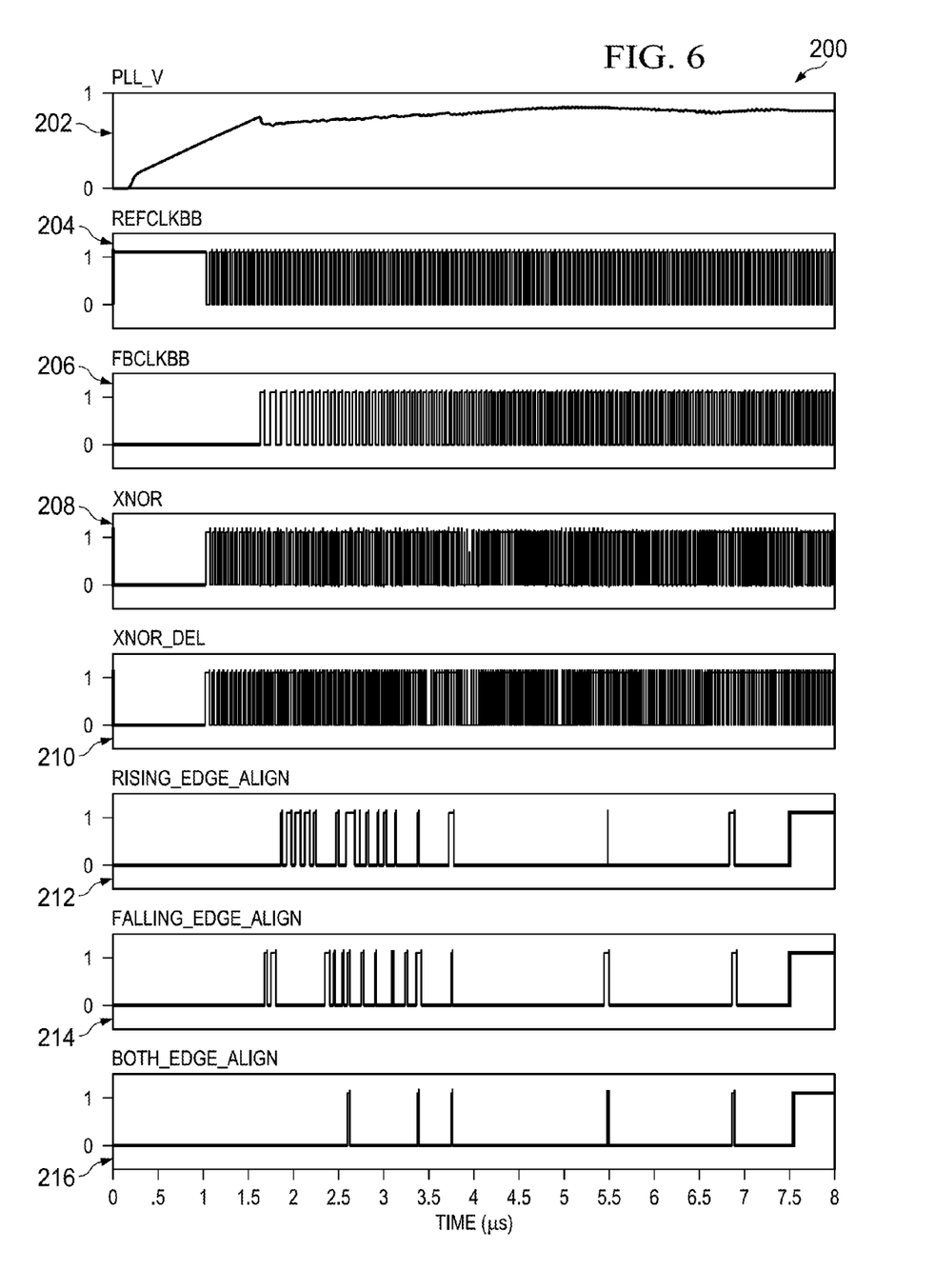
FIG. 6 is a timing diagram that illustrates alignment states of various signals of a clock alignment detector, such as the clock alignment detector of FIG. 2, according to various aspects of the present disclosure.
Figure 7:
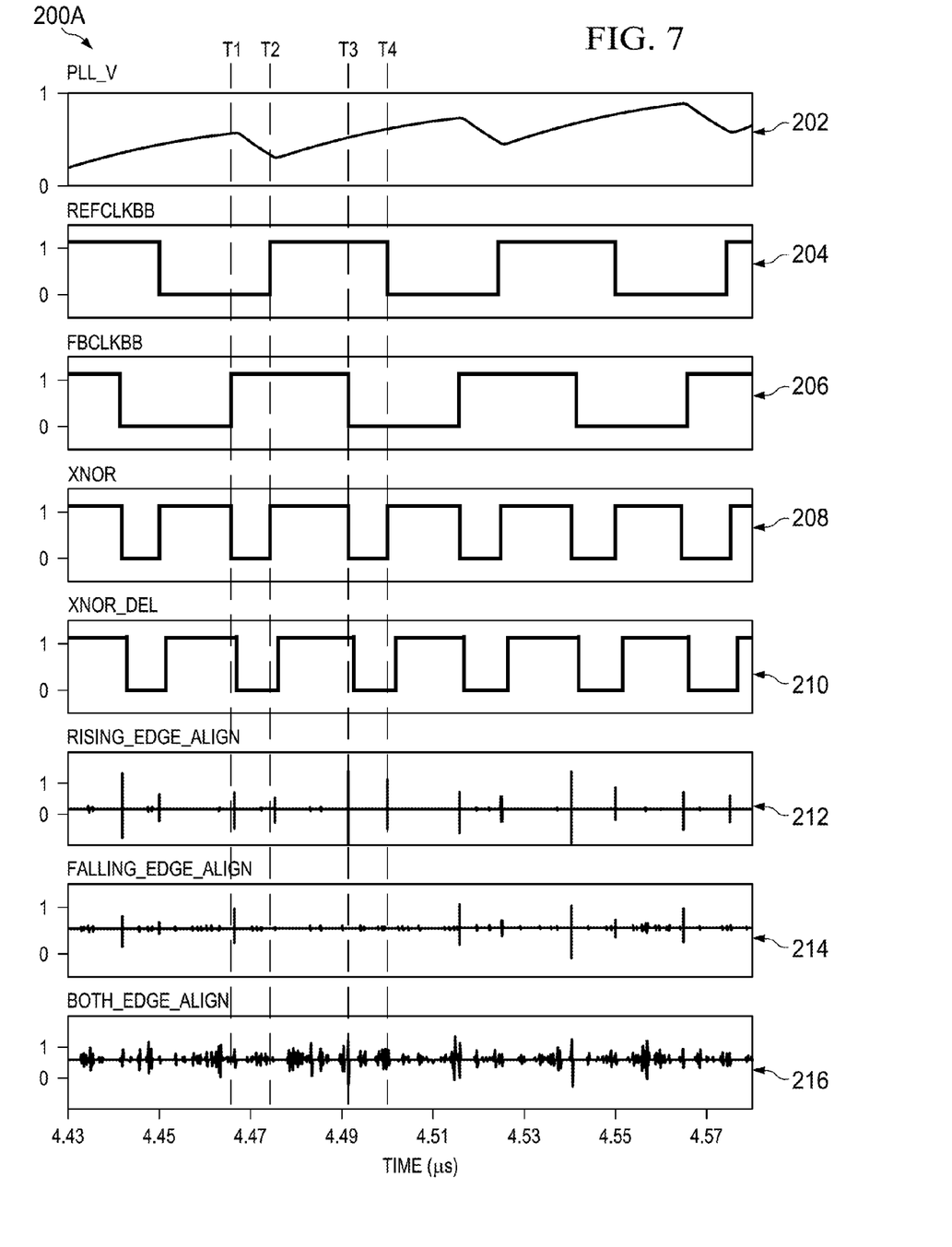
FIG. 7 and FIG. 8 include enlarged portions of the timing diagram of FIG. 6 according to various aspects of the present disclosure.
Figure 8:
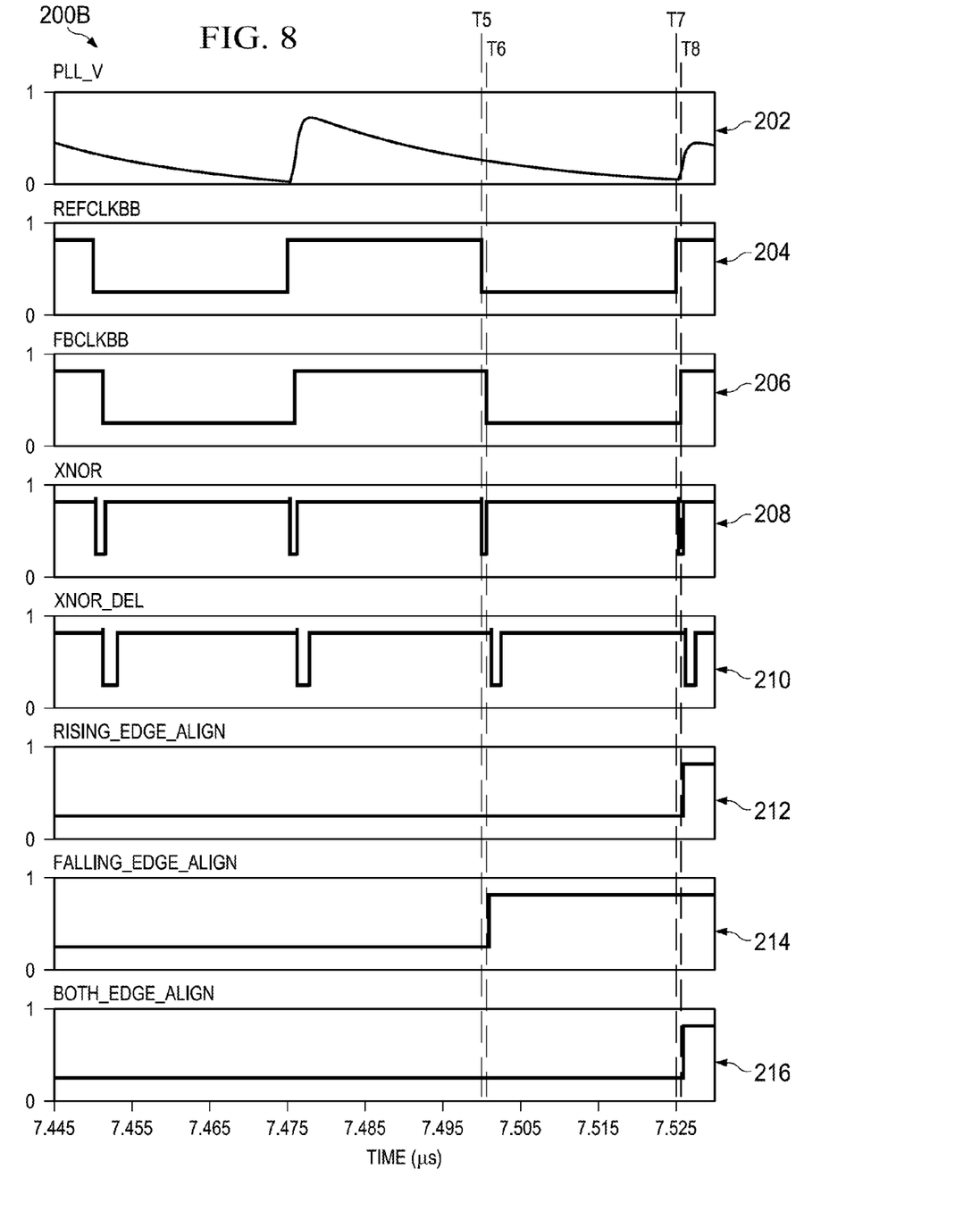

FIG. 6 is a timing diagram 200 that illustrates alignment states of various signals of a clock alignment detector, such as the clock alignment detector 100, according to various aspects of the present disclosure. FIG. 7 and FIG. 8 include enlarged portions of the timing diagram 200—respectively a portion 200A and a portion 200B of timing diagram 200—that further illustrate the alignment states of the various signals of the clock alignment detector according to various aspects of the present disclosure.

Timing diagram 200 includes a PLL voltage signal waveform 202 that illustrates a voltage associated with PLL 10, an input signal waveform 204 that illustrates input signal 102 (here, reference clock signal REFCLKBB), an input signal waveform 206 that illustrates input signal 104 (here, feedback clock signal FBCLKBB), an alignment state signal waveform 208 that illustrates alignment state signal 116 (here, XNOR signal), a delayed alignment state signal waveform 210 that illustrates delayed alignment state signal 112 (here, XNOR_DEL signal), a rising edge alignment state signal waveform 212 that illustrates rising edge alignment state signal 145 (here, RISING_EDGE_ALIGN signal), a falling edge alignment state signal waveform 214 that illustrates falling edge alignment state signal 147 (here, FALLING_EDGE_ALIGN signal), and a rising/falling edge alignment state signal waveform 216 that illustrates rising/falling edge alignment state signal 149 (here, BOTH_EDGE_ALIGN signal) over a time period. Each of the waveforms oscillate between a high voltage signal (HIGH output), such as a digital one, and a low voltage signal (LOW output), such as a digital zero. In the depicted timing diagram, input signal 102 has a 50/50 duty cycle.

Turning to FIG. 6, timing diagram 200 illustrates voltage signal 202 settling into a stable condition coinciding with input signal 102 and input signal 104 reaching an aligned (locked) state on both rising edges and falling edges—in the present example, between about 7 μs and about 8 μs. Note that clock alignment detector 100 detects moments of rising edge alignment (for example, between about 2 μs and about 3.5 μs) and moments of falling edge alignment (for example, between about 2.5 μs and about 3.5 μs) between input signal 102 and input signal 104 before true rising and falling edge alignment occurs (for example, around 7.5 μs) between the input signals. Other implementations may achieve an aligned state earlier or later than that depicted in timing diagram 200.

Turning to FIG. 7, portion 200A of timing diagram 200 illustrates the various waveforms between about 4.43 μs and about 4.58 μs. Portion 200A corresponds with a misaligned (out of lock) state of input signal 102 and input signal 104, where no edges of the input signals are aligned and the lock detect signal 106 of clock alignment detector 100 will indicate an unlock state. At time t1, alignment state signal 122 has a HIGH signal level when flip flop 130 is triggered by a rising edge of input signal 104 (FBCLKBB signal) because a signal level of delayed alignment state signal 112 (XNOR_DEL) is HIGH at the time of trigger; and at time t2, alignment state signal 124 has a LOW signal level when flip flop 132 is triggered by a rising edge of input signal 102 (REFCLKBB signal) because a signal level of delayed alignment state signal 112 (XNOR_DEL) is LOW at the time of trigger. At time t3, alignment state signal 126 has a HIGH signal level when flip flop 134 is triggered by a falling edge of input signal 104 (FBCLKBB signal) because a signal level of delayed alignment state signal 112 (XNOR_DEL) is HIGH at the time of trigger; and at time t4, alignment state signal 128 has a LOW signal level when flip flop 136 is triggered by a falling edge of input signal 102 (REFCLKBB signal) because a signal level of delayed alignment state signal 112 (XNOR_DEL) is LOW at the time of trigger. Consequently, since alignment state signal 122 has a HIGH signal level and alignment sate signal 124 has a LOW signal level, rising edge alignment state detector 144 generates rising edge alignment state signal 145 having a LOW signal level, indicating falling edges of input signal 102 and input signal 104 are misaligned; and since alignment state signal 126 has a HIGH signal level and alignment state signal 124 has a LOW signal level, falling edge alignment state detector 146 generates falling edge alignment state signal 147 having a LOW signal level, indicating falling edges of input signal 102 and input signal 104 are misaligned. Further, since both rising edge alignment state signal 145 and falling edge alignment state signal 147 have a LOW signal level, rising/falling edge alignment state detector 148 generates a LOW signal level, indicating that edge lock has not been achieved on both the rising and falling edges of the input signals.

Turning to FIG. 8, portion 200B of timing diagram 200 illustrates the various waveforms between about 7.445 µs and about 7.535 µs. Portion 200B corresponds with an aligned (locked) state of input signal 102 and input signal 104, where edges of the input signals reach alignment on rising edges and falling edges, and the lock detect signal 106 of clock alignment detector 100 will indicate a lock state. At time t5, alignment state signal 128 has a HIGH signal level when flip flop 136 is triggered by a falling edge of input signal 102 (REFCLKBB signal) because a signal level of delayed alignment state signal 112 (XNOR_DEL) is HIGH at the time of trigger; and at time t6, alignment state signal 126 has a HIGH signal level when flip flop 134 is triggered by a falling edge of input signal 104 (FBCLKBB signal) because a signal level of delayed alignment state signal 112 (XNOR_DEL) is HIGH at the time of trigger. At time t7, alignment state signal 124 has a HIGH signal level when flip flop 132 is triggered by a rising edge of input signal 102 (REFCLKBB signal) because a signal level of delayed alignment state signal 112 (XNOR_DEL) is HIGH at the time of trigger; and at time t8, alignment state signal 122 has a HIGH signal level when flip flop 130 is triggered by a rising edge of input signal 104 (FBCLKBB signal) because a signal level of delayed alignment state signal 112 (XNOR_DEL) is HIGH at the time of trigger. Consequently, at time t6, since alignment state signal 126 has a HIGH signal level and alignment state signal 124 has a HIGH signal level, falling edge alignment state detector 146 generates falling edge alignment state signal 147 having a HIGH signal level, indicating an aligned (locked) state of falling edges of input signal 102 and input signal 104; and at time t8, since alignment state signal 122 has a HIGH signal level and alignment sate signal 124 has a HIGH signal level, rising edge alignment state detector 144 generates rising edge alignment state signal 145 having a HIGH signal level, indicating an aligned (locked) state of rising edges of input signal 102 and input signal 104. Further, at time t8, since both rising edge alignment state signal 145 and falling edge alignment state signal 147 have a HIGH signal level, rising/falling edge alignment state detector 148 generates a HIGH signal level, indicating that an aligned (locked) state has been achieved on both the rising and falling edges of the input signals.

Benefits of introducing a programmable delay to alignment state signal 116, thereby providing delayed alignment state signal 112 for lock detection, can be seen in portion 200B of timing diagram 200. For example, note that, at time t5 and time t7, alignment state signal 116 (XNOR) has a HIGH signal level, similar to delayed alignment state signal 112. However, at time t6 and time t8, alignment state signal 116 (XNOR) has a LOW signal level, instead of the HIGH signal level of delayed alignment state signal 112. Accordingly, if alignment state signal 116 is input to flip flop 130, flip flop 132, flip flop 134, and flip flop 136, instead of delayed alignment state signal 112: (1) at time t6, alignment state signal 126 has a LOW signal level when flip flop 134 is triggered by a falling edge of input signal 104 (FBCLKBB signal) because a signal level of alignment state signal 116 (XNOR) is LOW at the time of trigger; and (2) at time t8, alignment state signal 122 has a LOW signal level when flip flop 130 is triggered by a rising edge of input signal 104 (FBCLKBB signal) because a signal level of alignment state signal 116 (XNOR) is LOW at the time of trigger. Consequently, this would result in rising edge alignment state detector 144 generating rising edge alignment state signal 147 having a LOW signal level, falling edge alignment state detector 146 generating falling edge alignment state signal 147 having a LOW signal level, and rising/falling edge alignment state detector 148 generating rising/falling edge alignment state signal 149 having a LOW signal level. Lock detect signal 106 would thus indicate that clock alignment has not yet occurred.

By adding a delay to alignment state signal 116 and using delayed alignment state signal 112 for lock detection, clock alignment detector 100 can compensate for system/device process, voltage, temperature, and/or other variations that inevitably affect the clock signals, thereby preventing perfect alignment (locking) of the clock signals. Further, incorporating variable delay into the alignment state signal evaluated for lock detection accounts for system/device designs having reference clocks with varying duty cycles, particularly designs having reference clocks with duty cycles other than a 50/50 duty cycle. In various implementations, the variable delay can be set so that some margin of phase error between clock signals still allows for lock detection on rising edges, falling edges, or even both rising and falling edges. Such variable delay is deterministic in that it can be defined based on a particular system/device clocks monitored by clock alignment detector 100 for lock detection. Furthermore, where duty cycle variations may not be adequately compensated for by the variable delay, clock alignment detector 100 facilitates lock detection on rising edges, falling edges, or both rising and falling edges. For example, facilitating lock detection on rising or falling edges only, clock alignment detector 100 can perform lock detection when the clock signals have significantly different duty cycles (for example, where the reference clock signal has a significantly different duty cycle than the feedback clock signal). Different embodiments may have different advantages, and no particular advantage is necessarily required of any of the embodiments described herein.

As noted above, though clock alignment detector 100 is described above as a clocking mechanism for PLL 10, clock alignment detector 100 can also be implemented in any device or system configuration that necessitates clock alignment detection. Furthermore, the various circuitry configurations described above can be replaced, substituted, or otherwise modified to accommodate various design implementations that achieve the lock detection mechanisms described herein. For example, other types of logic gates, flip flops, latches, and/or other components can be implemented to accommodate various design implementations. In various implementations, for example, AND gates can replace the NAND gate/inverter combinations of the rising, falling, and rising/falling edge alignment state detectors described above. In various implementations, depending on a type of desired lock detection, more or fewer logic gates, flip flops, latches, and/or other components can be implemented to achieve the lock detection mechanisms described herein. For example, where alignment is not needed for both edges of the clock signals, fewer logic gates, flip flops, latches, and/or other components can be implemented to achieve rising edge only lock detection and/or falling edge only lock detection. Moreover, using complementary electronic devices, hardware, software, etc. can offer an equally viable option for implementing the teachings of the present disclosure.

In various implementations, PLL 10, clock alignment detector 100, and/or the various the circuits and/or components of the FIGURES can be implemented on a board of an associated electronic device. The board can be a general circuit board that can hold various components of an internal electronic system of the electronic device and, further, provide connectors for other peripherals. The board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, other considerations, or a combination thereof. Other components, such as external storage, sensors, controllers for audio/video display, and peripheral devices may be attached to the board as plug-in cards, via cables, or integrated into the board itself.

In various implementations, PLL 10, clock alignment detector 100, and/or the various the circuits and/or components of the FIGURES can be implemented as stand-alone modules (for example, a device with associated components and circuitry configured to perform a specific application or function) or implemented as plug-in modules into application specific hardware of electronic devices. Note that particular embodiments of the present disclosure may be readily included in a system-on-chip (SOC) package, either in part, or in whole. An SOC represents an integrated circuit that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the various functions described herein may be implemented in one or more semiconductor cores (such as silicon cores) in application specific integrated circuits (ASICs), field programmable gate arrays (FPGAs), other semiconductor chips, or combinations thereof.

Note that the activities discussed above with reference to the FIGURES are applicable to any integrated circuits that involve signal processing, particularly those that can execute specialized software programs or algorithms, some of which may be associated with processing digitized real-time data. Certain embodiments can relate to multi-DSP signal processing, floating point processing, signal/control processing, fixed-function processing, microcontroller applications, etc. In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems. Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc. In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

The specifications, dimensions, and relationships outlined herein have only been offered for purposes of example and teaching only. Each of these may be varied considerably without departing from the spirit of the present disclosure, or the scope of the appended claims. The specifications apply only to non-limiting examples and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, circuits, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Further, note that references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. It is further noted that "coupled to" and "coupled with" are used interchangeably herein, and that references to a feature "coupled to" or "coupled with" another feature include any communicative coupling means, electrical coupling means, mechanical coupling means, other coupling means, or a combination thereof that facilitates the feature functionalities and operations, such as the detection mechanisms, described herein.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "steps for" are specifically used in the particular claims; and (b) does not intend, by any statement in the specification, to limit this disclosure in any way that is not otherwise reflected in the appended claims.

OTHER NOTES, EXAMPLES, AND IMPLEMENTATIONS

In various implementations, a system is provided that can be part of any type of computer, which can further include a circuit board coupled to a plurality of electronic components. The system can include means for generating a delayed alignment state signal that indicates an alignment state of a first clock signal and a second clock signal; means for generating at least two alignment state signals that indicate a state of the delayed alignment state signal when triggered by edges of the first clock signal and the second clock signal; means for generating an edge alignment state signal based on the at least two alignment state signals, wherein the edge alignment state signal indicates an alignment state of edges of the first clock signal and the second clock signal; and means for generating a lock detect signal based on the edge alignment state signal. The 'means for' in these instances can include (but is not limited to) using any suitable component discussed herein, along with any suitable software, circuitry, hub, computer code, logic, algorithms, hardware, controller, interface, link, bus, communication pathway, etc. In various implementations, the system includes memory that includes instructions that when executed cause the system to perform any of the activities discussed herein.

What is claimed is:

1. A clock alignment detector configured to detect alignment between a first clock signal and a second clock signal, the clock alignment detector comprising:
    an alignment state detector configured to generate a delayed alignment state signal that indicates an alignment state of the first clock signal and the second clock signal;
    a delayed alignment state detector configured to generate at least two alignment state signals that indicate a state of the delayed alignment state signal when triggered by edges of the first clock signal and the second clock signal; and
    an edge alignment state detector configured to generate an edge alignment state signal based on the at least two edge alignment state signals, wherein the edge alignment state signal indicates an alignment state of edges of the first clock signal and the second clock signal.

2. The clock alignment detector of claim 1 further comprising a timer configured to generate a lock detect signal based on the edge alignment state signal after a defined time period.

3. The clock alignment detector of claim 1, wherein the alignment state detector includes:
    an alignment state detector circuit configured to generate a general alignment state signal that indicates a general alignment state of the first clock signal and the second clock signal; and
    a variable delay circuit coupled to the alignment state detector circuit, the variable delay circuit configured to receive and introduce a delay to the general alignment state signal, thereby generating the delayed alignment state signal.

4. The clock alignment detector of claim 3, wherein the alignment state detector circuit includes an exclusive NOR (XNOR) logic gate that receives and processes the first clock signal and the second clock signal to generate the general alignment state signal.

5. The clock alignment detector of claim 3, wherein the variable delay circuit includes a chain of inverters, each inverter having an associated variable delay.

6. The clock alignment detector of claim 1, wherein the delayed alignment state detector includes:
    a first circuit that generates a first alignment state signal when triggered by a rising edge of the first clock signal, the first alignment state signal representing a state of the delayed alignment state signal on the rising edge of the first clock signal;
    a second circuit that generates a second alignment state signal when triggered by a rising edge of the second clock signal, the second alignment state signal representing a state of the delayed alignment state signal on the rising edge of the second clock signal;
    a third circuit that generates a third alignment state signal when triggered by a falling edge of the first clock signal, the third alignment state signal representing a state of the delayed alignment state signal on the falling edge of the first clock signal; and
    a fourth circuit that generates a fourth alignment state signal when triggered by a falling edge of the second clock signal, the fourth alignment state signal representing a state of the delayed alignment state signal on the falling edge of the second clock signal.

7. The clock alignment detector of claim 6, wherein the edge alignment state detector includes:
    a fifth circuit that generates a rising edge alignment state signal based on the first alignment state signal and the second alignment state signal;
    a sixth circuit that generates a falling edge alignment state signal based on the third alignment state signal and the fourth alignment state signal; and
    a seventh circuit that generates a rising and falling edge alignment state signal based on the rising edge alignment state signal and the falling edge alignment state signal.

8. The clock alignment detector of claim 7 further comprising a timer configured to generate a lock detect signal, after a defined time period, based on the rising edge alignment state signal, the falling edge alignment state signal, or the rising and falling edge alignment state signal.

9. The clock alignment detector of claim 1, wherein the first clock signal is a reference clock signal of a phase-locked loop and the second clock signal is a feedback clock signal of the phase-locked loop.

10. An integrated circuit comprising:
    a phase-locked loop configured to detect and maintain a phase relationship between a reference clock signal and a feedback clock signal; and
    a lock detector configured to detect alignment between the reference clock signal and the feedback clock signal and generate a lock detect signal, the lock detector including:
        an alignment state detector configured to generate a delayed alignment state signal that indicates an alignment state of the reference clock signal and the feedback clock signal;
        a delayed alignment state detector configured to generate at least two alignment state signals that indicate a state of the delayed alignment state signal when triggered by edges of the reference clock signal and the feedback clock signal; and
        an edge alignment state detector configured to generate an edge alignment state signal based on the at least two alignment state signals, wherein the edge alignment state signal indicates an alignment state of edges of the reference clock signal and the feedback clock signal.

11. The integrated circuit of claim 10 further comprising a timer configured to generate the lock detect signal based on the edge alignment state signal after a defined time period.

12. The integrated circuit of claim 10, wherein the alignment state detector includes a variable delay circuit configured to introduce a variable delay to a general alignment state signal, thereby generating the delayed alignment state signal.

13. The integrated circuit of claim 10, wherein the delayed alignment state detector is configured to generate the at least two alignment state signals when triggered by rising edges, falling edges, or both the rising edges and the falling edges of the reference clock signal and the feedback clock signal.

14. The integrated circuit of claim 13, wherein the delayed alignment state detector includes:
a first circuit that generates a first alignment state signal when triggered by a rising edge of the reference clock signal, the first alignment state signal representing a state of the delayed alignment state signal on the rising edge of the reference clock signal;
a second circuit that generates a second alignment state signal when triggered by a rising edge of the feedback clock signal, the second alignment state signal representing a state of the delayed alignment state signal on the rising edge of the feedback clock signal;
a third circuit that generates a third alignment state signal when triggered by a falling edge of the reference clock signal, the third alignment state signal representing a state of the delayed alignment state signal on the falling edge of the reference clock signal; and
a fourth circuit that generates a fourth alignment state signal when triggered by a falling edge of the feedback clock signal, the fourth alignment state signal representing a state of the delayed alignment state signal on the falling edge of the feedback clock signal.

15. The integrated circuit of claim 14, wherein the edge alignment state detector includes:
a fifth circuit that generates a rising edge alignment state signal based on the first alignment state signal and the second alignment state signal;
a sixth circuit that generates a falling edge alignment state signal based on the third alignment state signal and the fourth alignment state signal; and
a seventh circuit that generates a rising and falling edge alignment state signal based on the rising edge alignment state signal and the falling edge alignment state signal.

16. A method for detecting a clock alignment state between clock signals, the method comprising:
generating a delayed alignment state signal that indicates an alignment state of a first clock signal and a second clock signal;
generating at least two alignment state signals that indicate a state of the delayed alignment state signal when triggered by edges of the first clock signal and the second clock signal;
generating an edge alignment state signal based on the at least two alignment state signals, wherein the edge alignment state signal indicates an alignment state of edges of the first clock signal and the second clock signal; and
generating a lock detect signal based on the edge alignment state signal.

17. The method of claim 16 further comprising generating the lock detect signal after a defined time period.

18. The method of claim 16, wherein the generating the at least two alignment state signals is triggered by rising edges, falling edges, or both the rising edges and the falling edges of the first clock signal and the second clock signal, wherein the edge alignment state signal indicates an alignment state of the rising edges, the falling edges, or both the rising and the falling edges of the first clock signal and the second clock signal.

19. The method of claim 16 further comprising varying a delay of the delayed alignment state signal.

20. The method of claim 16, wherein the first clock signal is a reference clock signal of a phase-locked loop and the second clock signal is a feedback clock signal of the phase-locked loop.

21. A system for detecting an alignment state between clock signals, the system comprising:
means for generating a delayed alignment state signal that indicates an alignment state of a first clock signal and a second clock signal;
means for generating at least two alignment state signals that indicate a state of the delayed alignment state signal when triggered by edges of the first clock signal and the second clock signal; and
means for generating an edge alignment state signal based on the at least two alignment state signals, wherein the edge alignment state signal indicates an alignment state of edges of the first clock signal and the second clock signal.

22. The system of claim 21, further comprising means for generating a lock detect signal based on the edge alignment state signal.

23. The system of claim 21, wherein the means for generating the at least two alignment state signals is triggered by rising edges, falling edges, or both the rising edges and the falling edges of the first clock signal and the second clock signal, wherein the edge alignment state signal indicates an alignment state of the rising edges, the falling edges, or both the rising edges and the falling edges of the first clock signal and the second clock signal.

24. The system of claim 21, further comprising means for varying a delay of the delayed alignment state signal.

25. The system of claim 21, wherein the first clock signal is a reference clock signal of a phase-locked loop and the second clock signal is a feedback clock signal of the phase-locked loop.

* * * * *